(12) United States Patent
Rad et al.

(10) Patent No.: US 11,532,094 B2
(45) Date of Patent: Dec. 20, 2022

(54) SYSTEMS AND METHODS FOR THREE-DIMENSIONAL POSE DETERMINATION

(71) Applicant: Qualcomm Technologies, Inc., San Diego, CA (US)

(72) Inventors: Mahdi Rad, Graz (AT); Markus Oberweger, Graz (AT); Vincent Lepetit, Talance (FR)

(73) Assignee: QUALCOMM Technologies, Inc., San Diego, CA (US)

( * ) Notice: Subject to any disclaimer, the term of this patent is extended or adjusted under 35 U.S.C. 154(b) by 85 days.

(21) Appl. No.: 16/210,461

(22) Filed: Dec. 5, 2018

(65) Prior Publication Data

US 2020/0184668 A1 Jun. 11, 2020

(51) Int. Cl.
*G06T 7/70* (2017.01)
*G06F 30/00* (2020.01)
*G06N 3/08* (2006.01)
*G06T 7/50* (2017.01)

(52) U.S. Cl.
CPC ............... *G06T 7/70* (2017.01); *G06F 30/00* (2020.01); *G06N 3/08* (2013.01); *G06T 7/50* (2017.01); *G06T 2207/20081* (2013.01); *G06T 2207/20084* (2013.01)

(58) Field of Classification Search
CPC ... G06T 7/70; G06T 7/50; G06T 2207/20081; G06T 2207/20084; G06T 2207/10024; G06T 2207/10028; G06F 30/00; G06N 3/08; G06N 3/0454
See application file for complete search history.

(56) References Cited

U.S. PATENT DOCUMENTS

| 9,449,392 | B2 | 9/2016 | Han et al. |
| 9,875,427 | B2 | 1/2018 | Medasani et al. |
| 10,026,218 | B1* | 7/2018 | Mertens ............... H04N 13/332 |
| 10,719,742 | B2* | 7/2020 | Shechtman .......... G06N 3/0472 |
| 10,853,407 | B2* | 12/2020 | Bhardwaj ........... G06F 16/5854 |
| 11,048,977 | B1* | 6/2021 | Ulbricht ................. G06V 10/98 |
| 2013/0033484 | A1* | 2/2013 | Liao ........................ G06T 7/246 345/419 |
| 2016/0078287 | A1* | 3/2016 | Auge ..................... G06V 20/49 382/103 |
| 2017/0060250 | A1* | 3/2017 | Nayak ..................... G06F 3/017 |
| 2017/0272728 | A1* | 9/2017 | Rafii .................. G06Q 30/0631 |
| 2018/0018805 | A1* | 1/2018 | Kutliroff .................. G06T 7/33 |

(Continued)

OTHER PUBLICATIONS

M. Schwarz, H. Schulz and S. Behnke, "RGB-D object recognition and pose estimation based on pre-trained convolutional neural network features," 2015 IEEE International Conference on Robotics and Automation (ICRA), 2015, pp. 1329-1335, doi: 10.1109/ICRA. 2015.7139363. (Year: 2015).*

(Continued)

*Primary Examiner* — Asghar H Bilgrami
(74) *Attorney, Agent, or Firm* — Polsinelli LLP (57) ABSTRACT

A method is described. The method includes mapping features extracted from an unannotated red-green-blue (RGB) image of the object to a depth domain. The method further includes determining a three-dimensional (3D) pose of the object by providing the features mapped from the unannotated RGB image of the object to the depth domain to a trained pose estimator network.

30 Claims, 6 Drawing Sheets

(56) References Cited

U.S. PATENT DOCUMENTS

| | | | |
|---|---|---|---|
| 2019/0043203 A1* | 2/2019 | Fleishman | G06T 17/00 |
| 2019/0108651 A1* | 4/2019 | Gu | G06V 10/955 |
| 2019/0108678 A1* | 4/2019 | Hazeghi | H04N 5/33 |
| 2019/0130603 A1* | 5/2019 | Sun | G06N 3/0454 |
| 2021/0201078 A1* | 7/2021 | Yao | G06N 3/08 |
| 2021/0406644 A1* | 12/2021 | Salman | G06N 3/08 |

OTHER PUBLICATIONS

Li S., et al., "3D Human Pose Estimation from Monocular Images with Deep Convolutional Neural Network", Asian Conference on Computer Vision (ACCV), Singapore, 2014, pp. 1-16.

Rad M., et al., "Feature Mapping for Learning Fast and Accurate 3D Pose Inference from Synthetic Images", 2018 IEEE Conference on Computer Vision and Pattern Recognition, 2018, pp. 4663-4672.

Schwarz M., et al., "RGB-D Object Recognition and Pose Estimation based on Pre-trained Convolutional Neural Network Features", 2015 IEEE International Conference on Robotics and Automation (ICRA), Seattle, May 2015, 7 pages.

* cited by examiner

SYSTEMS AND METHODS FOR THREE-DIMENSIONAL POSE DETERMINATION

TECHNICAL FIELD

The present disclosure relates generally to electronic devices. More specifically, the present disclosure relates to systems and methods for three-dimensional (3D) pose determination.

BACKGROUND

Electronic devices (e.g., cellular telephones, wireless modems, computers, digital music players, Global Positioning System units, Personal Digital Assistants, gaming devices, etc.) have become a part of everyday life. Small computing devices are now placed in everything from vehicles to housing locks. The complexity of electronic devices has increased dramatically in the last few years. For example, many electronic devices have one or more processors that help control the device, as well as a number of digital circuits to support the processor and other parts of the device.

Some electronic devices may be configured to determine poses of objects in images. For example, it may be desirable to determine the three-dimensional (3D) pose of an object in a given red-green-blue (RGB) image or in RGB image sequences. Systems and methods for 3D pose determination in an RGB image may therefore be beneficial.

SUMMARY

A method is described. The method includes mapping features extracted from an unannotated red-green-blue (RGB) image of the object to a depth domain. The method also includes determining a three-dimensional (3D) pose of the object by providing the features mapped from the unannotated RGB image of the object to the depth domain to a trained pose estimator network.

The method may also include training the pose estimator network to determine 3D poses of an object in depth maps. Training the pose estimator network to determine 3D poses of objects in the depth maps may include training a depth map feature extractor network to extract features from the objects in the depth maps for use by the pose estimator network to determine the 3D poses of the objects.

The depth maps may be generated from depth data obtained from an RGB-D camera. The depth maps may be synthetic depth maps generated from a computer-aided design (CAD) model of the object using computer graphics rendering algorithms. The 3D pose of the object may be determined without an annotated RGB image.

Mapping features extracted from the unannotated RGB image of the object to the depth domain may include training an RGB image feature mapping network to map the features extracted from the unannotated RGB image to the depth domain.

The method may also include optimizing a loss function for parameters of the pose estimator network, the depth map feature extractor network and the RGB image feature mapping network. Optimizing the loss function may include adjusting the parameters of the pose estimator network and the depth map feature extractor network to minimize the difference between a ground-truth 3D pose and the 3D pose determined by the pose estimator network. Optimizing the loss function may include adjusting the parameters of the depth map feature extractor network and the RGB image feature mapping network to minimize losses from mapping features from an RGB image to the depth domain.

The method may also include using a maximum mean discrepancy (MMD) to minimize a domain shift between depth maps generated from depth data captured by an RGB-D camera and synthetically rendered depth maps.

An electronic device is also described. The electronic device includes a memory and a processor in communication with the memory. The processor is configured to map features extracted from an unannotated RGB image of the object to a depth domain. The processor is also configured to determine a 3D pose of the object by providing the features mapped from the unannotated RGB image of the object to the depth domain to a trained pose estimator network.

An apparatus is also described. The apparatus includes means for mapping features extracted from an unannotated RGB image of the object to a depth domain. The apparatus also includes means for determining a 3D pose of the object by providing the features mapped from the unannotated RGB image of the object to the depth domain to a trained pose estimator network.

A non-transitory computer readable medium storing computer executable code is also described. The computer readable medium includes code for causing an electronic device to map features extracted from an unannotated RGB image of the object to a depth domain. The computer readable medium further includes code for causing the electronic device to determine a 3D pose of the object by providing the features mapped from the unannotated RGB image of the object to the depth domain to a trained pose estimator network.

DETAILED DESCRIPTION

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

Figure 1:
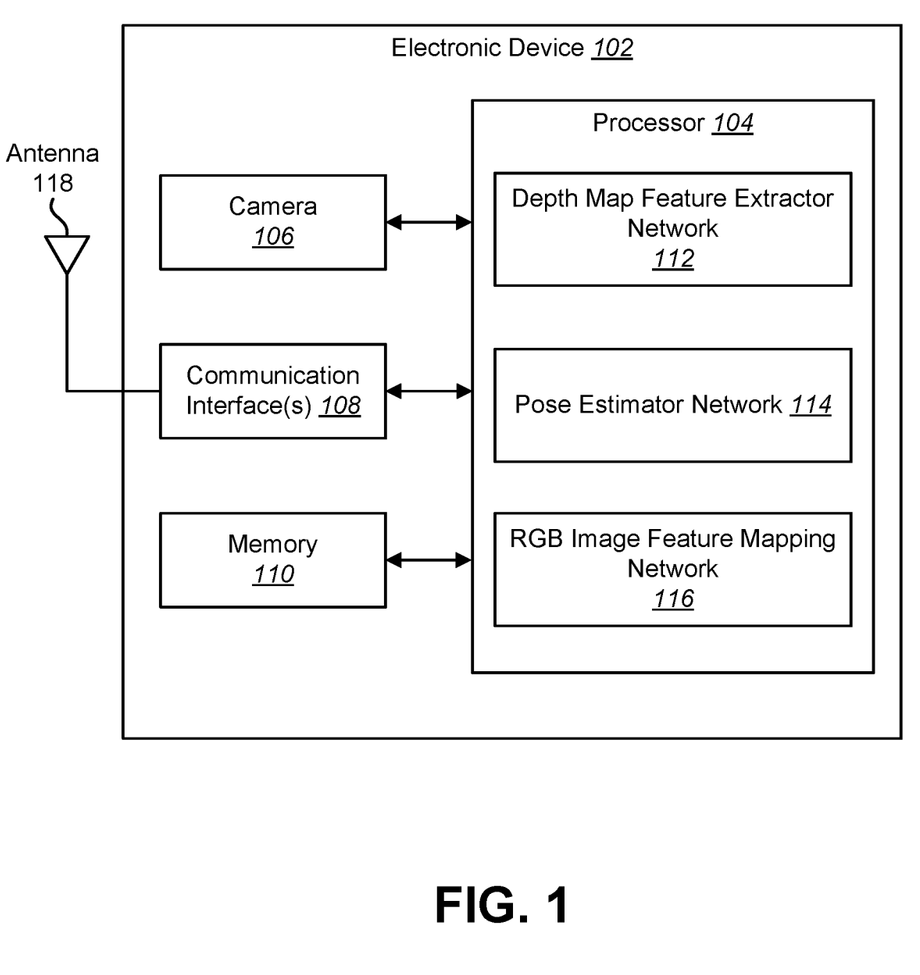
FIG. 1 is a block diagram illustrating one example of an electronic device in which systems and methods for three-dimensional (3D) pose determination may be implemented.

FIG. 1 is a block diagram illustrating one example of an electronic device 102 in which systems and methods for three-dimensional (3D) pose determination may be implemented. Examples of the electronic device 102 include cameras, video camcorders, digital cameras, cellular phones, smart phones, computers (e.g., desktop computers, laptop computers, etc.), tablet devices, media players, televisions, vehicles, automobiles, personal cameras, wearable cameras, virtual reality devices (e.g., headsets), augmented reality devices (e.g., headsets), mixed reality devices (e.g., headsets), action cameras, surveillance cameras, mounted cameras, connected cameras, robots, aircraft, drones, unmanned aerial vehicles (UAVs), smart applications, healthcare equipment, gaming consoles, personal digital assistants (PDAs), set-top boxes, appliances, three-dimensional (3D) scanners, etc.

The electronic device 102 may include one or more components or elements. One or more of the components or elements may be implemented in hardware (e.g., circuitry) or a combination of hardware and software and/or firmware (e.g., a processor 104 with instructions).

The electronic device 102 may be configured to perform 3D pose determination. Computer vision, machine learning, and image processing applications may benefit from determining the 3D pose of an object in a red-green-blue (RGB) image. For example, a computer vision application may track an object using RGB images captured by a camera 106.

However, determining the 3D pose of an object using RGB images presents challenges. In some implementations, one or more artificial neural networks (referred to herein as a "network" or "networks") may be trained to determine the 3D pose of an object in images. However, a large number of annotated (e.g., labeled) RGB image examples are needed to train a network for determining the 3D pose of an object in RGB images. As used herein, the terms "annotate" and "annotation" refer to labeling an image with information about a 3D pose of an object in the image.

For RGB images, annotation (e.g., labeling) is usually done manually, or with the help of some markers, which in both cases is very cumbersome, expensive, or sometimes even impossible. For example, to produce a training set of RGB images, a human may annotate multiple RGB images with information about the pose of the object. The network can then be trained using this annotated information. However, human annotation of images may be time-consuming and expensive. Furthermore, automated techniques to annotate RGB images may be impractical or impossible for RGB images due to the complexity of information in an RGB image. The systems and method described herein provide for 3D pose determination from RGB images without the use of annotated RGB images.

In some configurations, the electronic device 102 may include a processor 104, a memory 110, one or more cameras 106, and/or one or more communication interfaces 108. The processor 104 may be coupled to (e.g., in electronic communication with) the memory 110, camera(s) 106, and/or communication interface(s) 108.

The processor 104 may be a general-purpose single- or multi-chip microprocessor (e.g., an Advanced RISC Machine (ARM)), a special-purpose microprocessor (e.g., a digital signal processor (DSP)), a microcontroller, a programmable gate array, etc. The processor 104 may be referred to as a central processing unit (CPU). Although just a single processor 104 is shown in the electronic device 102, in an alternative configuration, a combination of processors 104 (e.g., an Image Signal Processor (ISP) and an application processor, an ARM and a DSP, etc.) could be used. The processor 104 may be configured to implement one or more of the methods disclosed herein. For example, the processor 104 may be configured to 3D pose determination.

The communication interface(s) 108 may enable the electronic device 102 to communicate with one or more other electronic devices 102. For example, the communication interface(s) 108 may provide an interface for wired and/or wireless communications. In some configurations, the communication interface(s) 108 may be coupled to one or more antennas 118 for transmitting and/or receiving radio frequency (RF) signals. Additionally or alternatively, the communication interface(s) 108 may enable one or more kinds of wireline (e.g., Universal Serial Bus (USB), Ethernet, etc.) communication.

In some configurations, multiple communication interfaces 108 may be implemented and/or utilized. For example, one communication interface 108 may be a cellular (e.g., 3G, Long Term Evolution (LTE), Code Division Multiple Access (CDMA), etc.) communication interface 108, another communication interface 108 may be an Ethernet interface, another communication interface 108 may be a universal serial bus (USB) interface, and yet another communication interface 108 may be a wireless local area network (WLAN) interface (e.g., Institute of Electrical and Electronics Engineers (IEEE) 802.11 interface). In some configurations, the communication interface 108 may send information (e.g., image information, surround view information, etc.) to and/or receive information from another electronic device 102 (e.g., a vehicle, a smart phone, a camera, a display, a remote server, etc.).

The electronic device 102 may obtain one or more images (e.g., digital images, image frames, video, etc.) and other sensor data (e.g., depth maps) from which the electronic device 102 may perform 3D pose determination. For example, the electronic device 102 may include one or more camera(s) 106 (e.g., normal cameras, wide-angle cameras, fisheye cameras, etc.). Additionally or alternatively, the electronic device 102 may request and/or receive the one or more images (e.g., training image sets) from another device (e.g., one or more external cameras coupled to the electronic device 102, a network server, traffic camera(s), drop camera(s), vehicle camera(s), web camera(s), etc.).

In some implementations, the camera 106 may be an RGB camera that captures RGB images. In some implementations, the camera 106 may be an RGB-D camera that captures depth maps along with RGB images. With an RGB-D camera, it is easy to capture RGB images and depth maps that correspond to the same 3D pose. As used herein, a depth map may be an image or image channel that contains information relating to the distance of surfaces of scene objects from a camera viewpoint. In other words, a depth map may indicate the distance of an object or objects relative to the camera capturing the image.

In some implementations, an RGB-D camera (e.g., with a depth sensor) may first capture depth data and then the RGB-D camera may compute the depth map from this depth data. The RGB-D camera may also perform post-processing of the depth data and/or depth map as depth data may be noisy. In other implementations, an RGB-D camera may capture depth data and this depth data may be provided to a processor (e.g., processor 104) to generate the depth map. Therefore, in some implementations, the RGB-D camera may generate the depth map and in other implementations, a processor external to the RGB-D camera may generate the depth map.

The processor 104 may implement a depth map feature extractor network 112 and a pose estimator network 114.

One or more of the images may be provided to the depth map feature extractor network 112 and pose estimator network 114. For example, the depth map feature extractor network 112 and pose estimator network 114 may obtain images from the one or more cameras 106 of the electronic device 102. Additionally or alternatively, the depth map feature extractor network 112 and pose estimator network 114 may obtain images captured from an external source.

In some implementations, the depth map feature extractor network 112 may be a convolutional neural network (CNN), deep network, deep CNN, etc. The depth map feature extractor network 112 may be configured to extract features from a depth map. Given an input depth map, the depth map feature extractor network 112 may extract features from the depth map. The extracted features may be given to the pose estimator network 114. For example, the depth map feature extractor network 112 may generate a vector that indicates features within a depth map. In some implementations the feature vector may be a 1024-vector of floating point numbers (e.g., float-32, 4 bytes).

The pose estimator network 114 may be configured to determine the 3D pose of an object from features in the depth domain. Given features extracted from a depth map using the depth map feature extractor network 112, the pose estimator network 114 may predict the 3D pose. For example, the pose estimator network 114 may receive the extracted features (e.g., feature vector) from the depth map feature extractor network 112. The pose estimator network 114 may then determine the 3D pose of an object in the depth map using the extracted features. In some implementations, the 3D pose of an object may be represented by 6 values, where three values correspond to the rotation of the object and three values correspond to the translation of the object in 3D space. In other words, the 3D pose determined by the pose estimator network 114 may be a six degrees of freedom (6DoF) pose. In some other implementations, the 3D pose of an object may be presented by two dimensional (2D) projections of an object's 3D bounding box.

Depth maps are much easier to annotate than RGB images. For example, the depth information in the depth map may include geometric information that is indicative of the 3D pose of the object as compared to color, texture and light intensity information included in an RGB image. Therefore, the depth data included in the depth maps may be annotated, or synthetic depth maps may be generated where the ground-truth 3D pose is known by construction.

Because annotated depth maps are easier to generate than annotated RGB images, the 3D pose estimator network 114 may be trained with the depth map feature extractor network 112 to determine the 3D pose of an object in the depth domain. For example, the 3D pose estimator network 114 may be trained with the depth map feature extractor network 112 to determine the 3D pose of an object using features extracted from depth maps. An example of training the 3D pose estimator network 114 and the depth map feature extractor network 112 is described in connection with FIG. 3.

In some implementations, the depth maps may be generated from depth data captured by a depth sensor (e.g., RGB-D camera). In other implementations, the depth maps may be synthetically generated from an image (e.g., RGB image) using image processing. For example, depth maps may be synthetically generated from a computer-aided design (CAD) model of the object using computer graphics rendering algorithms Synthetic depth maps include distance information and may be comparable to the depth sensor (e.g., RGB-D) approach to obtaining depth maps. In other words, depth sensor-generated depth maps may be very similar to synthetic depth maps.

The 3D pose estimator network 114 and the depth map feature extractor network 112 training may be performed using training sets of depth maps. In some implementations, the training sets of depth maps may include depth sensor data-generated depth maps and/or synthetic depth maps.

The processor 104 may also implement an RGB image feature mapping network 116 to map features extracted from unannotated RGB images of the object to the depth domain. In some implementations, the RGB image feature mapping network 116 may first extract features from an unannotated RGB image to produce a feature vector. Given an input RGB image, the RGB image feature mapping network 116 may extract corresponding features from RGB image to further map them to the depth domain. In some implementations, during training, the mapping may be learned by optimizing the distance between features extracted from RGB images using an RGB image feature extractor and features extracted from depth maps using the depth map feature extractor network 112. As used herein, an unannotated RGB image may be an RGB image that does not include supplemental labeling (e.g., 3D pose information, feature markers, etc.). In other words, the unannotated RGB image may be an RGB image as captured by a camera 106 without additional labeling.

The RGB image feature mapping network 116 may map the extracted features from the unannotated RGB image to the depth domain. For example, the RGB image feature mapping network 116 may map the extracted features from the RGB image to features extracted by the depth map feature extractor network 112 from a depth map that corresponds to the same 3D pose as the RGB image. The RGB image feature mapping network 116 may map the extracted features in color space to corresponding locations in the depth domain.

In some approaches, the RGB image feature mapping network 116 may be implemented as a single network. In other approaches, the RGB image feature mapping network 116 may be implemented as two separate networks. For example, the RGB image feature mapping network 116 may include a first network to extract features from the RGB images and a second network to map the extracted features to the depth domain.

The RGB image feature mapping network 116 may be trained to extract features from RGB images and map them to the depth domain. The RGB image feature mapping network 116 may provide the features mapped from the unannotated RGB image of the object to the depth domain to the pose estimator network 114 so that at run time, the pose estimator network 114 may determine the 3D pose of the object from the unannotated RGB image. An example of training the RGB image feature mapping network 116 is described in connection with FIG. 4.

The described systems and methods may be applied to various types of objects. For example, the 3D pose determination is not limited to rigid objects only. It may apply to many different applications, such as hand pose determination, human pose determination, etc.

The systems and methods described herein provide for accurate and efficient 3D pose determination of an object in unannotated RGB images. By mapping features from the color domain to the depth domain, a pose estimator network 114 that is trained using annotated depth maps may be used to determine the 3D pose of an object in unannotated RGB images. This may facilitate training of the depth map feature extractor network 112, the pose estimator network 114 and RGB image feature mapping network 116 because depth maps are much easier to annotate than RGB images. For example, the depth information included in the depth map may be used as annotations for training the depth map feature extractor network 112, the pose estimator network 114 and RGB image feature mapping network 116. This may avoid the expense and time associated with manually-annotated RGB images and the inaccuracies associated with automated RGB image annotation.

Figure 2:
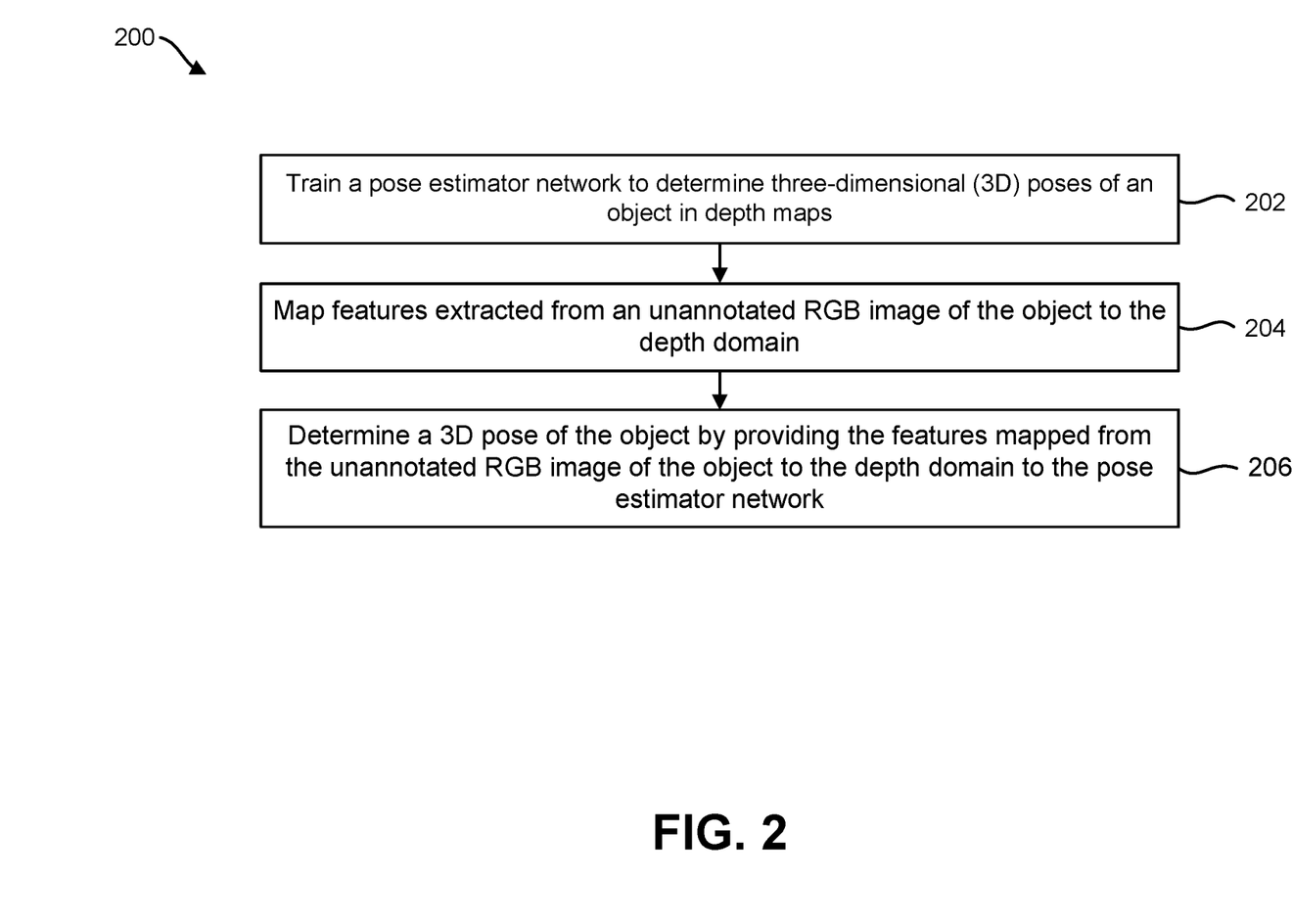
FIG. 2 is a flow diagram illustrating one configuration of a method for 3D pose determination.

FIG. 2 is a flow diagram illustrating one configuration of a method 200 for 3D pose determination. The method 200 may be performed by an electronic device 102 as described in connection with FIG. 1.

The electronic device 102 may train 202 a pose estimator network 114 to determine three-dimensional (3D) poses of an object in depth maps. For example, the electronic device 102 may train a depth map feature extractor network 112 to extract features from the objects in the depth maps for use by the pose estimator network 114 to determine the three dimensional (3D) poses of the objects. In some implementations, the depth maps may be generated from depth data captured by RGB-D camera. In some implementations, the depth maps may be synthetic depth maps created from RGB images.

The electronic device 102 may map 204 features extracted from an unannotated RGB image of the object to the depth domain. For example, the electronic device 102 may train an RGB image feature mapping network 116 to map 204 the features extracted from the unannotated RGB image to the depth domain. The electronic device 102 may first extract features from an unannotated RGB image to produce a feature vector. The electronic device 102 may then map the extracted features in color space to corresponding features in the depth domain.

The electronic device 102 may determine 206 a 3D pose of the object by providing the features mapped from the unannotated RGB image of the object to the depth domain to the pose estimator network 114. For example, because the pose estimator network 114 is trained to determine 3D poses of an object in depth maps, the features mapped from the unannotated RGB image to the depth domain may be in a format that the pose estimator network 114 can use to determine the 3D pose. The 3D pose of the object may be determined without an annotated RGB image. In other words, because the pose estimator network 114 is trained to determine 3D poses of an object in the depth domain, the pose estimator network 114 may determine the 3D pose of the object without using annotated RGB images during training.

Figure 3:
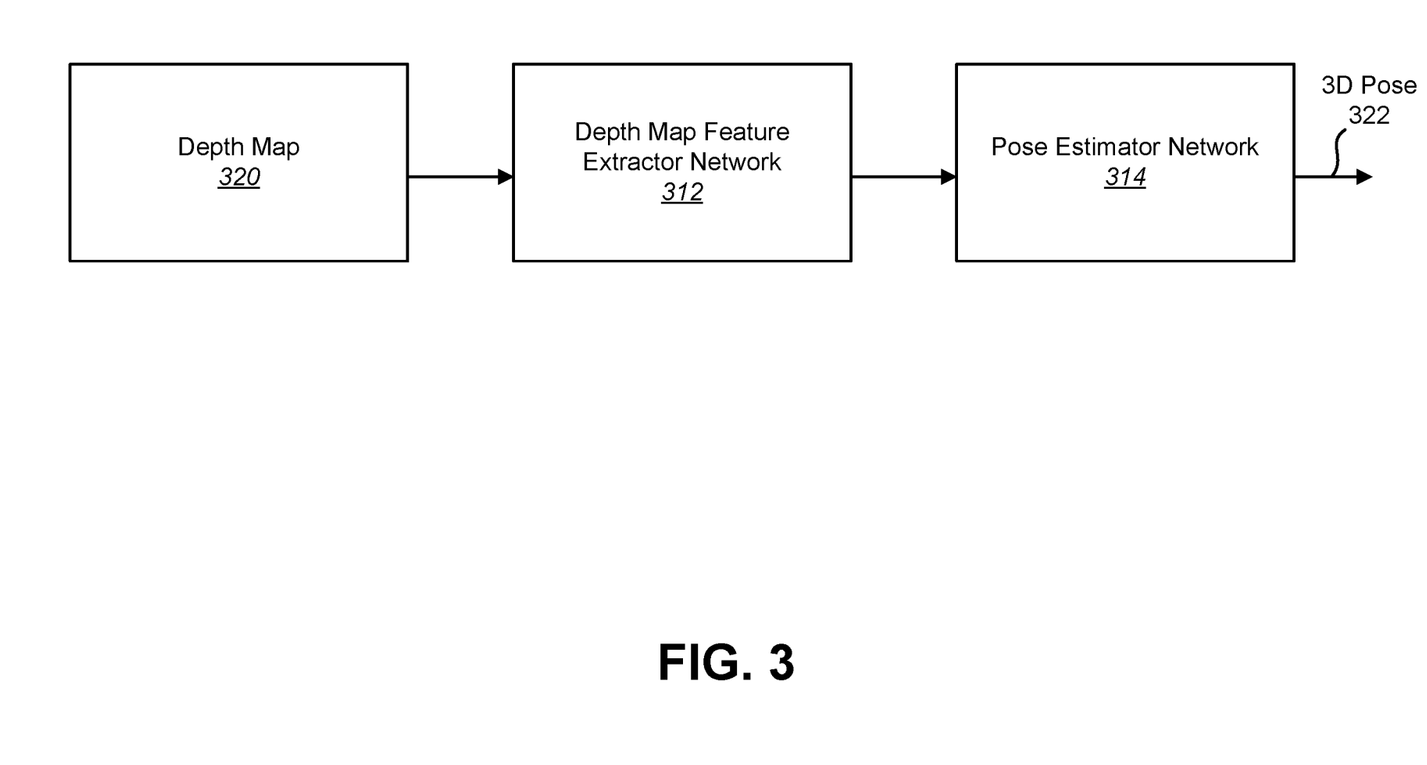
FIG. 3 is a block diagram illustrating an example of training a depth map feature extractor network and a pose estimator network for 3D pose determination.

FIG. 3 is a block diagram illustrating an example of training a depth map feature extractor network 312 and a pose estimator network 314 for 3D pose determination. The depth map feature extractor network 312 and pose estimator network 314 described in connection with FIG. 3 may be implemented in accordance with the depth map feature extractor network 112 and pose estimator network 114 described in connection with FIG. 1.

A depth map 320 may be provided to the depth map feature extractor network 312. In some implementations, the depth map 320 may be generated from depth data acquired from a depth sensor (e.g., RGB-D camera). In other implementations, the depth map 320 may be synthetically generated from an object's CAD model. In some implementations, the depth map 320 may be annotated (e.g., labeled) with information about the 3D pose of the object. This 3D pose annotation may be used as ground-truth information during training of the pose estimator network 314.

The depth map feature extractor network 312 may extract features from the depth map 320. This may be accomplished as described in connection with FIG. 1. For example, the depth map feature extractor network 312 may generate a feature vector for the extracted features. The depth map feature extractor network 312 may provide the extracted features to the pose estimator network 314.

The pose estimator network 314 may determine the 3D pose 322 of an object from features in the depth domain. This may be accomplished as described in connection with FIG. 1. The 3D pose 322 determination may be expressed according to Equation (1).

$$3DPose = P_{DEPTH}(F_{DEPTH}(I^{DEPTH})). \quad (1)$$

In Equation (1), $I^{DEPTH}$ is a depth map 320, $F_{DEPTH}$ is the depth map feature extractor network 312 and $P_{DEPTH}$ is the pose estimator network 314. In some implementations, the depth map feature extractor network 312 and pose estimator network 314 may be trained together with an RGB image feature mapping network to optimize each of the three networks, as described in connection with FIG. 4.

Figure 4:
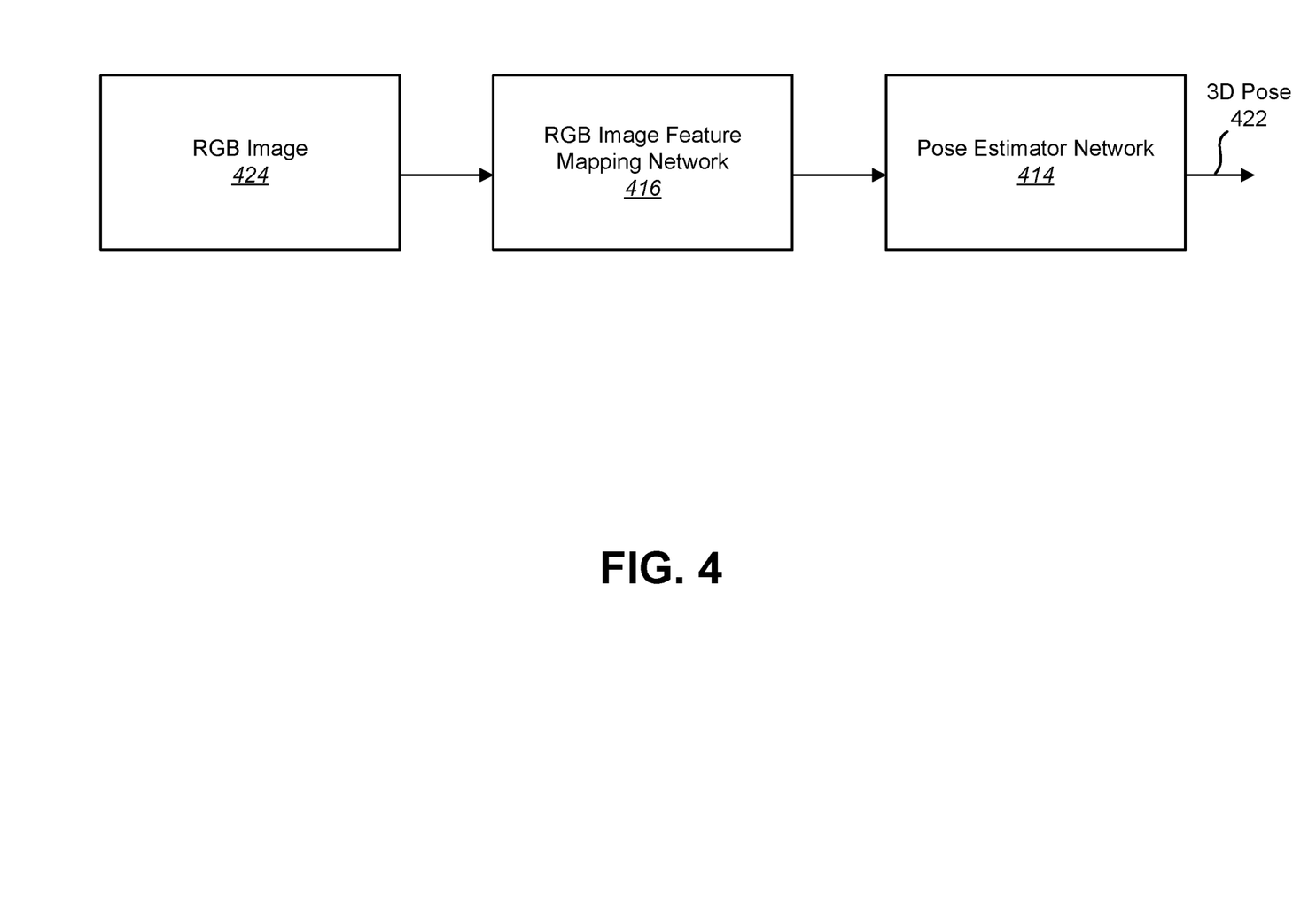
FIG. 4 is a block diagram illustrating an example of training a RGB image feature mapping network for use in 3D pose determination.

FIG. 4 is a block diagram illustrating an example of training a RGB image feature mapping network 416 for use in 3D pose determination. The RGB image feature mapping network 416 described in connection with FIG. 4 may be implemented in accordance with the RGB image feature mapping network 116 described in connection with FIG. 1.

An RGB image 424 may be provided to the RGB image feature mapping network 416. The RGB image 424 may be an unannotated RGB image that does not include supplemental labeling (e.g., 3D pose information, feature markers, etc.).

The RGB image feature mapping network 416 may extract features from the RGB image 424. The RGB image feature mapping network 416 may then map the extracted features from the unannotated RGB image 424 to the depth domain. For example, the mapping may be learned during training by optimizing the distance between features extracted from RGB images using the RGB image feature mapping network 416 and features extracted from depth maps using the depth map feature extractor network 312, as expressed by Equation (5).

At this point, the mapped features may be in a format that can be used by the pose estimator network 414 to determine the 3D pose 422 of an object in the RGB image 424. In other words, upon mapping the features from the color domain to the depth domain, the input to the pose estimator network 414 may be in the same format as the input provided by the depth map feature extractor network 312 to the pose estimator network 314, as described in connection with FIG. 3. The 3D pose 422 determination may be expressed according to Equation (2).

$$3DPose = P_{DEPTH}(FM_{RGB}(I^{RGB})). \quad (2)$$

In Equation (2), $I^{RGB}$ is a RGB image 424, $FM_{RGB}$ is the RGB image feature mapping network 416 and $P_{DEPTH}$ is the pose estimator network 414.

The depth map feature extractor network 312 and pose estimator network 314 described in FIG. 3 may be trained together with the RGB image feature mapping network 416 to optimize each of the three networks. For example, the loss function of Equation (3) may be optimized over the parameters ($\theta_P$, $\theta_F$, $\theta_{FM}$) of the three networks.

$$L(\theta_P, \theta_F, \theta_{FM}; T^{DEPTH}, T^{RGB-D}) = L_{DEPTH} + \beta L_{FM} + \gamma L_{MMD} \quad (3)$$

In Equation (3), L( ) is the loss function. $\theta_P$, $\theta_F$, $\theta_{FM}$ are weight parameters of the pose estimator network 314, the depth map feature extractor network 312 and the RGB image feature mapping network 416, respectively. $T^{DEPTH}$ may be a training set of depth maps of the object annotated (e.g., labeled) with the 3D pose. In some implementations, $T^{DEPTH}$ may be a set of synthetic depth maps. $T^{RGB-D}$ may be a training set made of RGB images 424 each paired to a depth map captured with an RGB-D camera that corresponds to the same RGB image 424. It should be noted that labeled depth maps of $T^{DEPTH}$ are not necessarily generated from depth data captured with the same camera as the RGB-D camera of $T^{RGB-D}$.

In Equation (3), β and γ are meta-parameters to control the balance between the losses. $L_{DEPTH}$ is the loss for predicting 3D poses 322 from depth maps 320. $L_{DEPTH}$ may be expressed according to Equation (4).

$$L_{DEPTH} = \sum_{(I_i^{DEPTH2}, Y_i) \in T^{DEPTH}} \| P_{DEPTH}(F_{DEPTH}(I_i^{DEPTH2}; \theta_F); \theta_P) - Y_i \|^2 \quad (4)$$

In Equation (4), $I_i^{DEPTH2}$ is a depth map, Y is ground-truth 3D pose information and i is an index of images in the training set. As described above, $T^{DEPTH}$ may be a set of synthetic depth maps, $F_{DEPTH}$ is the depth map feature extractor network 312 and $P_{DEPTH}$ is the pose estimator network 314. In Equation (4), $\theta_P$ and $\theta_F$ are variable weight parameters of the pose estimator network 314 and the depth map feature extractor network 312, respectively. $\theta_P$ and $\theta_F$ may be optimized to minimize the losses of $L_{DEPTH}$. In other words, $\theta_P$ and $\theta_F$ may be adjusted to minimize the difference between the ground-truth 3D pose Y and the predicted 3D pose determined by the pose estimator network 314.

In Equation (3), $L_{FM}$ is the loss for mapping features from an RGB image 424 to the depth domain. $L_{FM}$ may be expressed according to Equation (5).

$$L_{FM} = \sum_{(I_i^{RGB}, I_i^{DEPTH}) \in T^{RGB-D}} \| FM_{RGB}(I_i^{RGB}; \theta_{FM}) - F_{DEPTH}(I_i^{DEPTH}; \theta_F) \|^2 \quad (5)$$

In Equation (5), $I_i^{RGB}$ is an RGB image 424, $I_i^{DEPTH}$ is a depth map and i is an index of images in the training set. As described above, $T^{RGB-D}$ may be a training set that is made of RGB images 424 each paired to a depth map generated from depth data captured with an RGB-D camera that corresponds to the same RGB image 424, $F_{DEPTH}$ is the depth map feature extractor network 312 and $FM_{RGB}$ vis the RGB image feature mapping network 416. In Equation (4), $\theta_{FM}$ and $\theta_F$ are variable weight parameters of the RGB image feature mapping network 416 and the depth map feature extractor network 312, respectively. $\theta_{FM}$ and $\theta_F$ may be optimized to minimize the losses of $L_{FM}$.

It should be noted that Equation (5) may be used to train the RGB image feature mapping network 416 to map the RGB image features to corresponding depth domain features. In some implementations, at training time the mapping may be learned by optimizing the distance between features extracted from RGB images using the RGB image feature mapping network 416 and features extracted from depth maps using the depth map feature extractor network 312.

In Equation (3), $L_{MMD}$ is the maximum mean discrepancy loss to minimize distance between the distributions of the depth maps from two training-sets. For example, a first training set $T^{RGB-D}$ may include a number of depth maps $I_i^{DEPTH}$ generated from depth data obtained from an RGB-D camera. A second training set $T^{DEPTH}$ may include a number synthetic depth maps $I_j^{DEPTH2}$, where j is the depth map index. $L_{MMD}$ may be expressed according to Equation (6).

$$L_{MMD} = \left\| \sum_{i=1}^{N^{RGB-D}} \frac{\phi(F_{DEPTH}(I_i^{DEPTH}; \theta_F))}{N^{RGB-D}} - \sum_{j=1}^{N^{DEPTH}} \frac{\phi(F_{DEPTH}(I_j^{DEPTH2}; \theta_F))}{N^{DEPTH}} \right\|^2 \quad (6)$$

In Equation (6), φ(•) denotes the mapping to reproducing kernel Hilbert space (RKHS), where "•" is input to the mapping to RKHS. $F_{DEPTH}$ is the depth map feature extractor network 312. $N^{RGB-D}$ is the number of depth maps in the training set $T^{RGB-D}$ and $N^{DEPTH}$ is the number of depth maps in training set $T^{DEPTH}$. $\theta_F$ may be optimized to minimize the losses of $L_{MMD}$. Because there are two different depth maps (e.g., synthetic and sensor-based) from two different cameras, the depth map feature extractor network 312 may be optimized according to Equation (6) to extract approximately the same features for the two different cameras.

Figure 5:
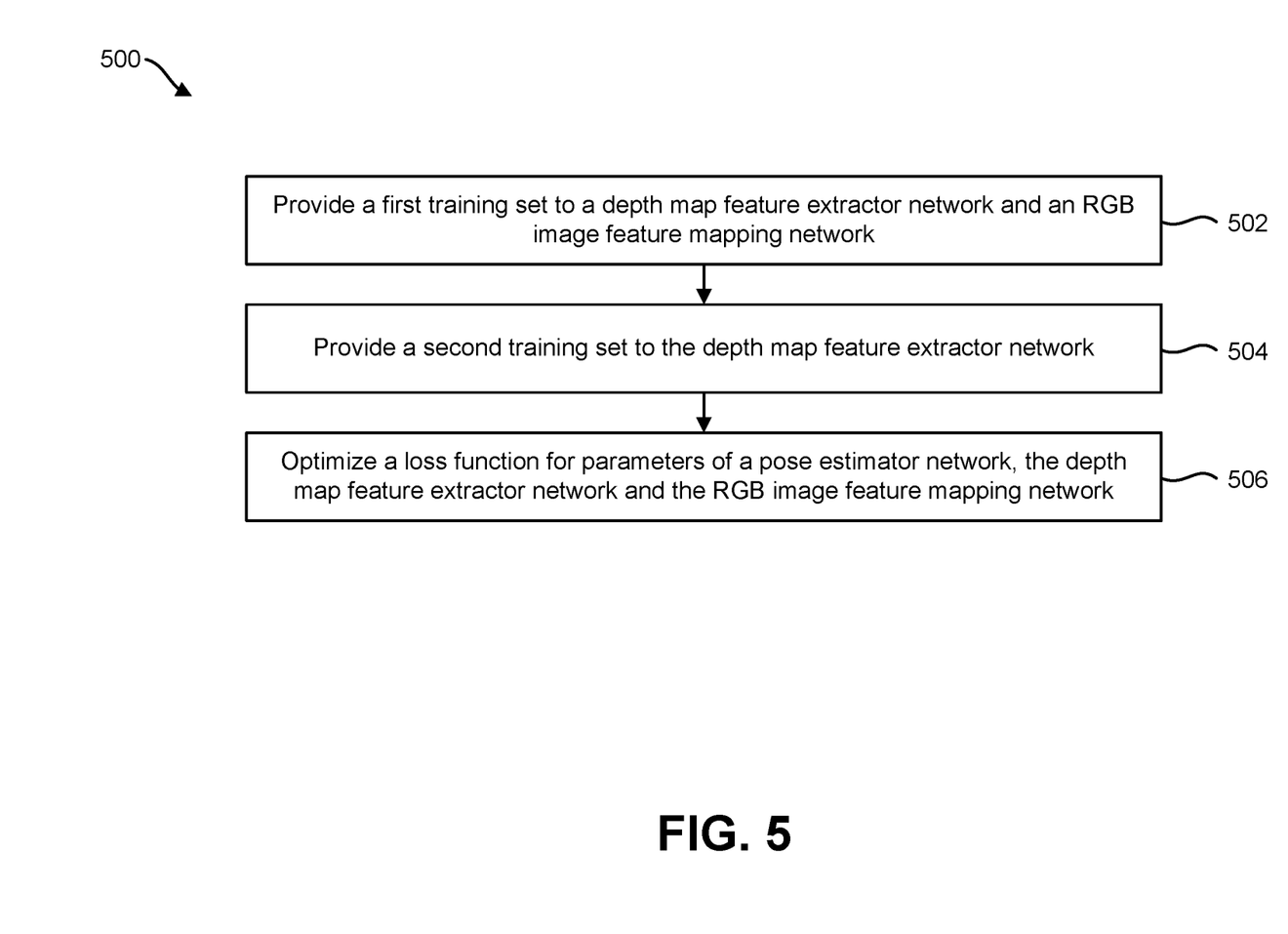
FIG. 5 is a flow diagram illustrating one configuration of a method for training a depth map feature extractor network, a pose estimator network and an RGB image feature mapping network for 3D pose determination.

FIG. 5 is a flow diagram illustrating one configuration of a method 500 for training a depth map feature extractor network 312, a pose estimator network 314 and an RGB image feature mapping network 416 for 3D pose determination. A first training set $T^{RGB-D}$ may be provided 502 to the depth map feature extractor network 312 and the RGB image feature mapping network 416. The first training set $T^{RGB-D}$ may include a number of RGB images $I^{RGB}$ paired with depth maps $I^{DEPTH}$ generated from depth data obtained from an RGB-D camera.

A second training set $T^{DEPTH}$ may be provided 504 to the depth map feature extractor network 312. The second training set $T^{DEPTH}$ may include a number of synthetic depth maps $I^{DEPTH2}$.

A loss function L for parameters $\theta_P$, $\theta_F$, $\theta_{FM}$ of the pose estimator network 314, the depth map feature extractor network 312 and the RGB image feature mapping network 416 may be optimized 506. This may be accomplished as described in connection with FIG. 4. For example, the parameters $\theta_P$, $\theta_F$, $\theta_{FM}$ may be optimized to minimize the loss function of Equation (3) using Equations (4)-(6).

In some implementations, optimizing 506 the loss function L may include adjusting the parameter $\theta_P$ of the pose estimator network 314 and the parameter $\theta_F$ of the depth map feature extractor network 312 to minimize the difference between a ground-truth 3D pose and the 3D pose determined by the pose estimator network 314. This may be accomplished according to Equation (4).

In some implementations, optimizing 506 the loss function L may include adjusting the parameter $\theta_F$ of the depth map feature extractor network 312 and parameter $\theta_{FM}$ of the RGB image feature mapping network 116 to minimize losses from mapping features from an RGB image to the depth domain. This may be accomplished according to Equation (5).

In some implementations, optimizing 506 the loss function L may include using a maximum mean discrepancy (MMD) to minimize the domain shift between depth maps generated from depth data captured by an RGB-D camera and synthetically rendered depth maps. As used herein, the term domain shift refers to the distance between the distributions of the depth maps generated from depth data captured by an RGB-D camera and synthetically rendered depth maps. This may be accomplished according to Equation (6).

Figure 6:
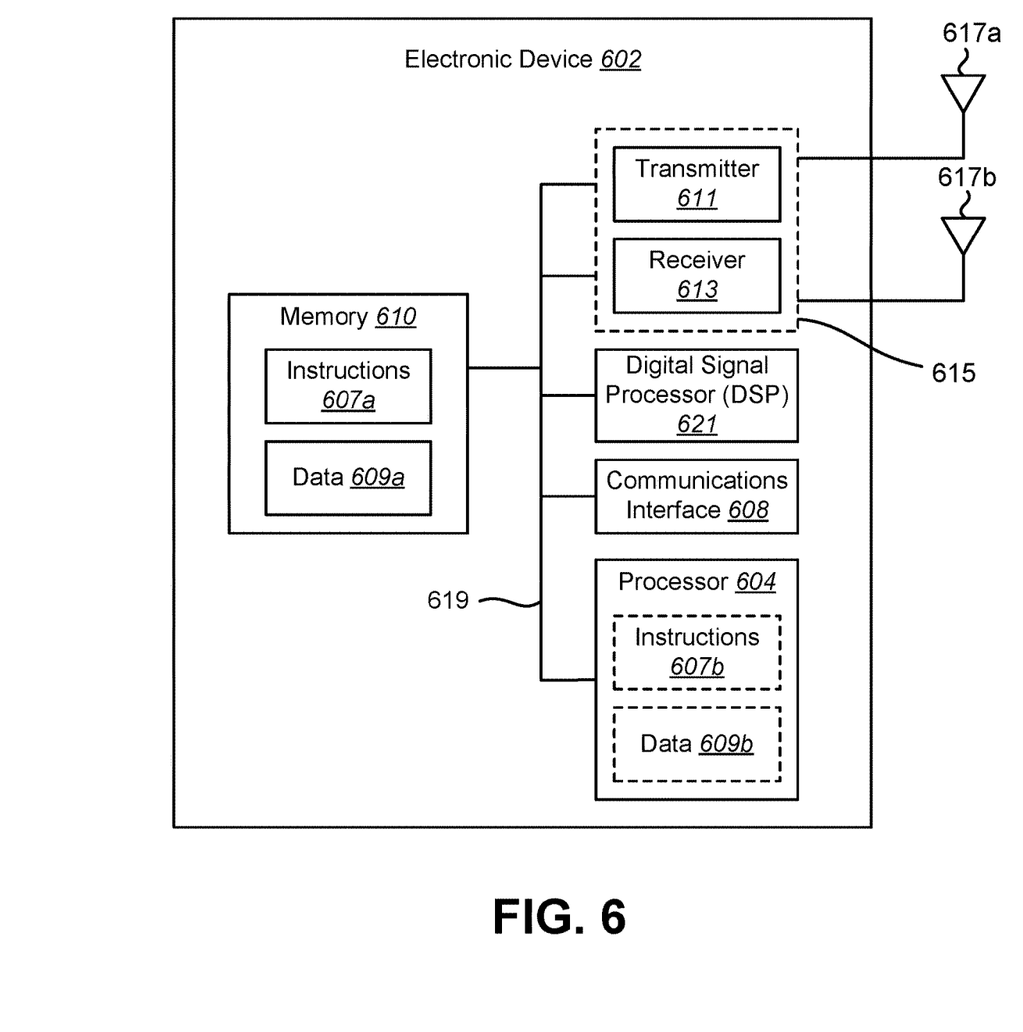
FIG. 6 illustrates certain components that may be included within an electronic device configured to implement various configurations of the systems and methods disclosed herein.

FIG. 6 illustrates certain components that may be included within an electronic device 602 configured to implement various configurations of the systems and methods disclosed herein. The electronic device 602 may be implemented in accordance with one or more of the electronic devices 102 described herein.

The electronic device 602 includes a processor 604. The processor 604 may be a general-purpose single- or multi-chip microprocessor (e.g., an ARM), a special-purpose microprocessor (e.g., a digital signal processor (DSP)), a microcontroller, a programmable gate array, etc. The processor 604 may be referred to as a central processing unit (CPU). Although just a single processor 604 is shown in the electronic device 602, in an alternative configuration, a combination of processors (e.g., an ARM and DSP) could be implemented.

The electronic device 602 also includes memory 610. The memory 610 may be any electronic component capable of storing electronic information. The memory 610 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM), registers, and so forth, including combinations thereof.

Data 609a and instructions 607a may be stored in the memory 610. The instructions 607a may be executable by the processor 604 to implement one or more of the methods, procedures, steps, and/or functions described herein. Executing the instructions 607a may involve the use of the data 609a that is stored in the memory 610. When the processor 604 executes the instructions 607, various portions of the instructions 607b may be loaded onto the processor 604 and/or various pieces of data 609b may be loaded onto the processor 604.

The electronic device 602 may also include a transmitter 611 and/or a receiver 613 to allow transmission and reception of signals to and from the electronic device 602. The transmitter 611 and receiver 613 may be collectively referred to as a transceiver 615. One or more antennas 617a-b may be electrically coupled to the transceiver 615. The electronic device 602 may also include (not shown) multiple transmitters, multiple receivers, multiple transceivers and/or additional antennas.

The electronic device 602 may include a digital signal processor (DSP) 621. The electronic device 602 may also include a communications interface 608. The communications interface 608 may allow and/or enable one or more kinds of input and/or output. For example, the communications interface 608 may include one or more ports and/or communication devices for linking other devices to the electronic device 602. In some configurations, the communications interface 608 may include the transmitter 611, the receiver 613, or both (e.g., the transceiver 615). Additionally or alternatively, the communications interface 608 may include one or more other interfaces (e.g., touchscreen, keypad, keyboard, microphone, camera, etc.). For example, the communication interface 608 may enable a user to interact with the electronic device 602.

The various components of the electronic device 602 may be coupled together by one or more buses, which may include a power bus, a control signal bus, a status signal bus, a data bus, etc. For the sake of clarity, the various buses are illustrated in FIG. 6 as a bus system 619.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general-purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

As used herein, the term "and/or" should be interpreted to mean one or more items. For example, the phrase "A, B and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B and C" or the phrase "at least one of A, B or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B and C" or the phrase "one or more of A, B or C" should be interpreted to mean any of: only A, only B, only C, A and B (but not C), B and C (but not A), A and C (but not B), or all of A, B, and C.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method comprising:
   obtaining an unannotated red-green-blue (RGB) image of an object in a pose;
   extracting, by a first neural network, a set of image features from the unannotated RGB image of the object;
   mapping, by the first neural network, the set of image features extracted from the unannotated RGB image of the object to a set of depth features associated with a depth map that corresponds to a same pose as the pose of the object in the unannotated RGB image, the first neural network including an RGB image feature mapping neural network trained to map features extracted from unannotated RGB images to a depth domain; and
   determining, by a second neural network using the set of depth features mapped from the unannotated RGB image of the object, a three-dimensional (3D) pose of the object, the second neural network being different from the first neural network and including a pose estimator neural network trained to determine 3D poses of objects in the depth domain.

2. The method of claim 1, further comprising training the pose estimator neural network to determine 3D poses of one or more objects in one or more depth maps.

3. The method of claim 2, wherein training the pose estimator neural network to determine 3D poses of the one or more objects in the one or more depth maps comprises:
   training a depth map feature extractor neural network to extract features associated with the one or more objects from the one or more depth maps for use by the pose estimator neural network to determine the 3D poses of the objects.

4. The method of claim 2, wherein the one or more depth maps are generated from depth data obtained from at least one RGB-D camera.

5. The method of claim 2, wherein the one or more depth maps are synthetic depth maps generated from a computer-aided design (CAD) model of the object.

6. The method of claim 1, wherein mapping the set of image features extracted from the unannotated RGB image of the object to the set of depth features associated with the depth map comprises:
   training the RGB image feature mapping neural network to map the set of image features extracted from the unannotated RGB image to the set of depth features associated with the depth map.

7. The method of claim 1, wherein the 3D pose of the object is determined without an annotated RGB image.

8. The method of claim 3, further comprising optimizing a loss function for parameters of the pose estimator neural network, the depth map feature extractor neural network and the RGB image feature mapping neural network.

9. The method of claim 8, wherein optimizing the loss function comprises adjusting the parameters of the pose estimator neural network and the depth map feature extractor neural network to minimize a difference between a ground-truth 3D pose and the 3D pose determined by the pose estimator neural network.

10. The method of claim 8, wherein optimizing the loss function comprises adjusting the parameters of the depth map feature extractor neural network and the RGB image feature mapping neural network to minimize losses from mapping features from an RGB image to the depth domain.

11. The method of claim 1, further comprising using a maximum mean discrepancy (MMD) to minimize a domain shift between depth maps generated from depth data captured by an RGB-D camera and synthetically rendered depth maps.

12. An electronic device, comprising:
   a memory; and
   a processor in communication with the memory, the processor configured to:
      obtain an unannotated red-green-blue (RGB) image of an object in a pose;

extract, using a first neural network, a set of image features from the unannotated RGB image of the object;

map, using the first neural network, the set of image features extracted from the unannotated RGB image of the object to a set of depth features associated with a depth map that corresponds to a same pose as the pose of the object in the unannotated RGB image, the first neural network including an RGB image feature mapping neural network trained to map features extracted from unannotated RGB images to a depth domain; and determine, using a second neural network based on the set of depth features mapped from the unannotated RGB image of the object, a three-dimensional (3D) pose of the object, the second neural network being different from the first neural network and including a pose estimator neural network trained to determine 3D poses of objects in the depth domain.

13. The electronic device of claim 12, wherein the processor is further configured to train the pose estimator neural network to determine 3D poses of one or more objects in one or more depth maps.

14. The electronic device of claim 13, wherein, to train the pose estimator neural network to determine 3D poses of the one or more objects in the one or more depth maps, the processor is configured to:

train a depth map feature extractor neural network to extract features associated with the one or more objects from the one or more depth maps for use by the pose estimator neural network to determine the 3D poses of the objects.

15. The electronic device of claim 13, wherein the one or more depth maps are generated from depth data obtained from at least one RGB-Depth (RGB-D) camera.

16. The electronic device of claim 13, wherein the one or more depth maps are synthetic depth maps generated from a computer-aided design (CAD) model of the object.

17. The electronic device of claim 12, wherein, to map the set of image features extracted from the unannotated RGB image of the object to the set of depth features associated with the depth map, the processor is configured to:

train the RGB image feature mapping neural network to map the set of image features extracted from the unannotated RGB image to the set of depth features associated with the depth map.

18. The electronic device of claim 12, wherein the 3D pose of the object is determined without an annotated RGB image.

19. The electronic device of claim 14, wherein the processor is further configured to optimize a loss function for parameters of the pose estimator neural network, the depth map feature extractor neural network and the RGB image feature mapping neural network.

20. An apparatus, comprising:

means for obtaining an unannotated red-green-blue (RGB) image of an object in a pose;

means for extracting, by a first neural network, a set of image features from the unannotated RGB image of the object;

means for mapping, using the first neural network, the set of image features extracted from the unannotated RGB image of the object to a set of depth features associated with a depth map that corresponds to a same pose as the pose of the object in the unannotated RGB image, the first neural network including an RGB image feature mapping neural network trained to map features extracted from unannotated RGB images to a depth domain; and means for determining, using a second neural network based on the set of depth features mapped from the unannotated RGB image of the object, a three-dimensional (3D) pose of the object, the second neural network being different from the first neural network and including a pose estimator neural network trained to determine 3D poses of objects in the depth domain.

21. The apparatus of claim 20, further comprising means for training the pose estimator neural network to determine 3D poses of one or more objects in one or more depth maps.

22. The apparatus of claim 21, wherein the means for training the pose estimator neural network to determine 3D poses of the one or more objects in the one or more depth maps comprise:

means for training a depth map feature extractor neural network to extract features associated with the one or more objects from the one or more depth maps for use by the pose estimator neural network to determine the 3D poses of the objects.

23. The apparatus of claim 20, wherein the means for mapping the set of image features extracted from the unannotated RGB image of the object to the set of depth features associated with the depth map comprise:

means for training the RGB image feature mapping neural network to map the set of image features extracted from the unannotated RGB image to the set of depth features associated with the depth map.

24. The apparatus of claim 20, wherein the 3D pose of the object is determined without an annotated RGB image.

25. The apparatus of claim 22, further comprising means for optimizing a loss function for parameters of the pose estimator neural network, the depth map feature extractor neural network and the RGB image feature mapping neural network.

26. A non-transitory computer readable medium of an electronic device storing computer executable code, comprising:

code for causing the electronic device to obtain an unannotated red-green-blue (RGB) image of an object in a pose;

code for causing the electronic device to extract, using a first neural network, a set of image features from the unannotated RGB image of the object;

code for causing the electronic device to map, using the first neural network, the set of image features extracted from the unannotated RGB image of the object to a set of depth features associated with a depth map that corresponds to a same pose as the pose of the object in the unannotated RGB image, the first neural network including an RGB image feature mapping neural network trained to map features extracted from unannotated RGB images to a depth domain; and code for causing the electronic device to determine, using a second neural network based on the set of depth features mapped from the unannotated RGB image of the object, a three-dimensional (3D) pose of the object, the second neural network being different from the first neural network and including a pose estimator neural network trained to determine 3D poses of objects in the depth domain.

27. The computer readable medium of claim 26, further comprising code for causing an electronic device to train the pose estimator neural network to determine 3D poses of one or more objects in one or more depth maps.

28. The computer readable medium of claim 27, wherein the code for causing the electronic device to train the pose estimator neural network to determine 3D poses of the one or more objects in the one or more depth maps comprises:
    code for causing the electronic device to train a depth map feature extractor neural network to extract features associated with the one or more objects from the one or more depth maps for use by the pose estimator neural network to determine the 3D poses of the objects.

29. The computer readable medium of claim 26, wherein the code for causing the electronic device to map the set of image features extracted from the unannotated RGB image of the object to the set of depth features associated with the depth map comprises:
    code for causing the electronic device to train an RGB image feature mapping neural network to map the set of image features extracted from the unannotated RGB image to the set of depth features associated with the depth map.

30. The computer readable medium of claim 26, wherein the 3D pose of the object is determined without an annotated RGB image.

\* \* \* \* \*